United States Patent [19]

Chaffin, deceased et al.

[11] Patent Number: 4,797,716
[45] Date of Patent: Jan. 10, 1989

[54] FIELD-EFFECT TRANSISTOR HAVING A SUPERLATTICE CHANNEL AND HIGH CARRIER VELOCITIES AT HIGH APPLIED FIELDS

[75] Inventors: Roger J. Chaffin, deceased, late of Albuquerque, by Nancy Davis, legal representative; Ralph Dawson, Albuquerque; Ian J. Fritz, Albuquerque; Gordon C. Osbourn, Albuquerque; Thomas E. Zipperian, Albuquerque, all of N. Mex.

[73] Assignee: The United States of America as represented by the United States Department of Energy, Washington, D.C.

[21] Appl. No.: 59,365

[22] Filed: Jun. 8, 1987

Related U.S. Application Data

[63] Continuation-in-part of Ser. No. 602,109, Apr. 4, 1984, abandoned.

[51] Int. Cl.$^4$ .............................................. H01L 29/80
[52] U.S. Cl. ......................................... 357/22; 357/4; 357/16
[58] Field of Search ........................... 357/22 A, 4, 16

[56] References Cited

U.S. PATENT DOCUMENTS 4,163,237 7/1979 Dingle et al. ..................... 357/22 A
4,297,718 10/1981 Nishizawa et al. ............... 357/22 E

OTHER PUBLICATIONS

Osbourn, J. Appl. Phys, vol. 53, No. 3 Mar. 1982, pp. 1586–1589.
Osbourn et al., Appl. Phys. Lett., vol. 41, No. 2, Jul. 15, 1982, pp. 172–174.
Osbourn et al., J. Vac. Science Technology, vol. 21, No. 2, Jul./Aug. 1982, pp. 469–472.

Primary Examiner—William D. Larkins
Attorney, Agent, or Firm—George H. Libman; James H. Chafin; Judson R. Hightower

[57] ABSTRACT

A field effect transistor comprises a semiconductor having a source, a drain, a channel and a gate in operational relationship. The semiconductor is a strained layer superlattice comprising alternating quantum well and barrier layers, the quantum well layers and barrier layers being selected from the group of layer pairs consisting of InGaAs/AlGaAs, InAs/InAlGaAs, and InAs/InAlAsP. The layer thicknesses of the quantum well and barrier layers are sufficiently thin that the alternating layers constitute a superlattice which has a superlattice conduction band energy level structure in k-vector space which includes a lowest energy $\Gamma$-valley and a next lowest energy L-valley, each k-vector corresponding to one of the orthogonal directions defined by the planes of said layers and the directions perpendicular thereto. The layer thicknesses of the quantum well layers are selected to provide a superlattice $L_{2D}$-valley which has a shape which is substantially more two-dimensional than that of said bulk L-valley.

9 Claims, 1 Drawing Sheet

STRAINED LAYER SUPERLATTICE FET

FIG. 1
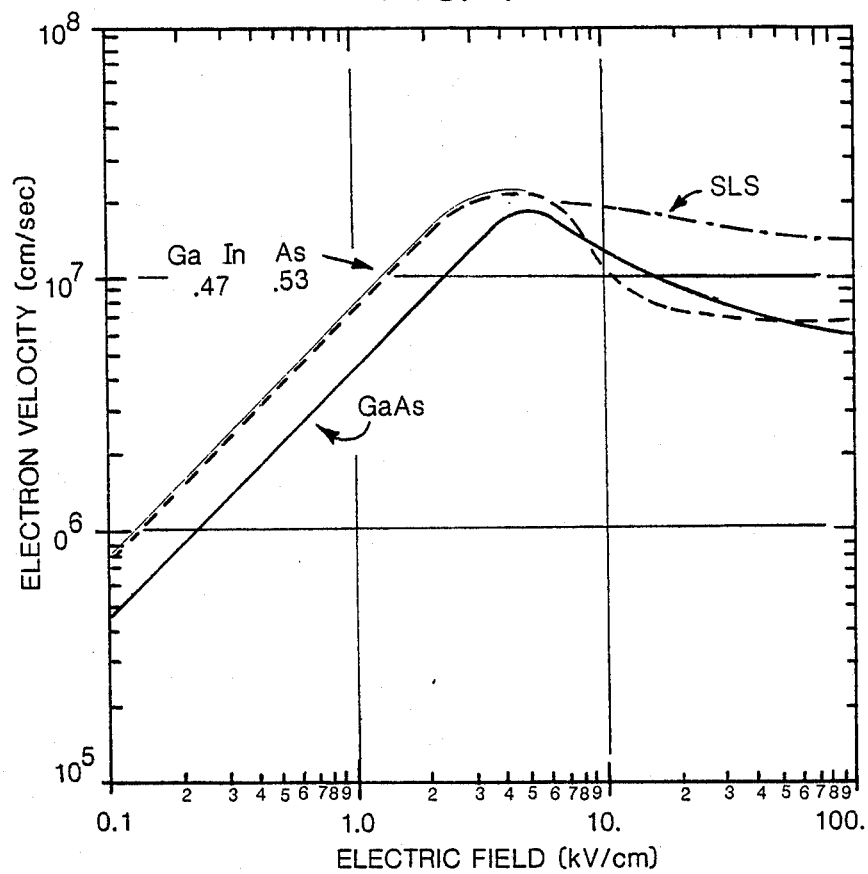
STRAINED LAYER SUPERLATTICE FET
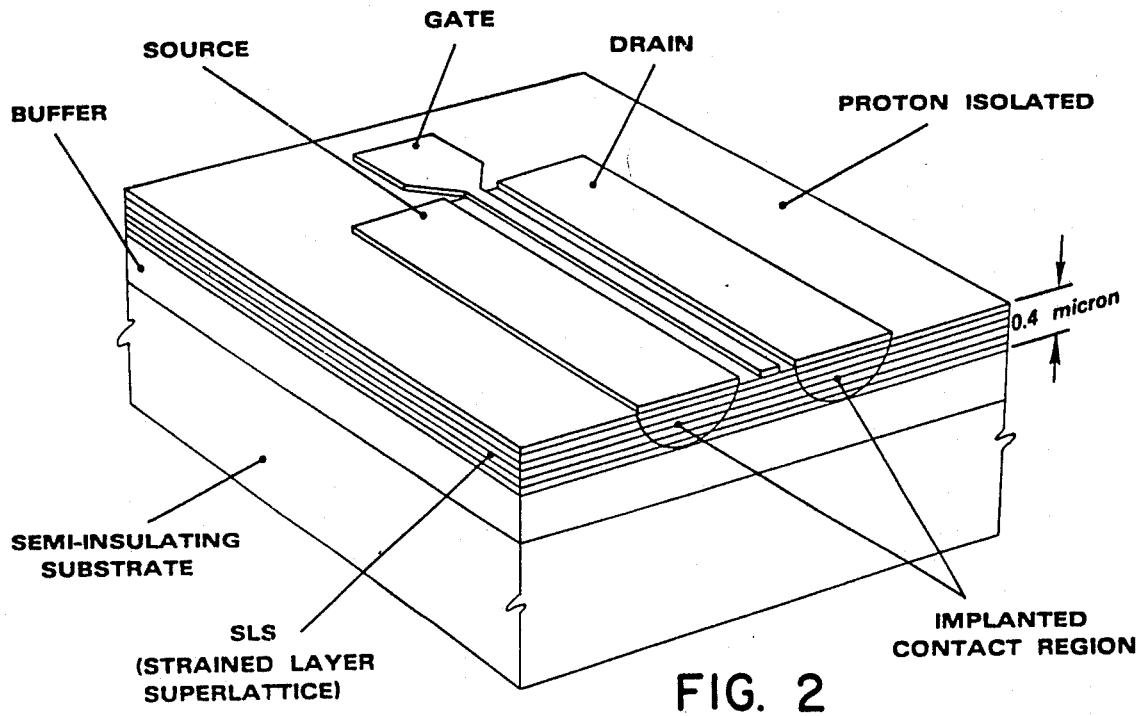
FIG. 2

FIELD-EFFECT TRANSISTOR HAVING A SUPERLATTICE CHANNEL AND HIGH CARRIER VELOCITIES AT HIGH APPLIED FIELDS

The U. S. Government has rights in this invention pursuant to Contract No. DE-AC04-76DP00789 between the U.S. Department of Energy and AT&T Technologies, Inc.

This application is a continuation-in-part of Ser. No. 602,109, filed Apr. 4, 1984 now abandoned.

BACKGROUND OF THE INVENTION

This invention relates to improved field-effect transistors, especially those used in applications demanding high-frequency and/or high-power output, typically microwave field-effect transistors.

Field-effect transistors (FET's), including microwave FET's, have been in existence for some time. See, e.g., J. V. DiLorenzo and D. D. Khandelwal, *GaAs FET Principles and Technology*, Artech House, 1982, whose disclosure is incorporated by reference herein. One well-known microwave device uses single crystal GaAs (gallium arsenide) or InGaAs (indium gallium arsenide) as a channel (or conduction material). In these materials, the electron carriers suffer from the Gunn effect as shown in FIG. 1. The carriers "slow down" when a large field is applied to the device. This effect is due to scattering of electrons, e.g., by phonons, into higher energy valleys which have poorer transport properties associated therewith. This "slowing down" of the carriers is detrimental to the frequency response of the device because the transit time of electrons is given by:

$$\text{Frequency Response} = V/A \quad (1)$$

The power output of a device (per unit area) is proportional to voltage × current or:

$$\text{Power Output} = (A)(E)(v)(n) \quad (2)$$

where A=channel length; E=electric field; v=average velocity; and n=carrier density. For a given channel length, A, Equations (1) and (2) demonstrate the desirability of having both the highest velocity, v, and the highest field, E, for a good high frequency, high power amplifier. FIG. 1 shows that this condition cannot be met simultaneously in conventional GaAs and InGaAs FET's because of the Gunn effect.

Other prior art microwave FET devices have extremely short channel lengths. In these devices, a velocity overshoot or ballistic transport can occur and the Gunn effect can be overcome (DiLorenzo and Khandelwal, supra, p. 735). However, due to the short length, A, these are (from Equation 2) low power devices.

The High Electron Mobility Transistor (DiLorenzo and Khandelwal, supra, p. 741) is another device wherein a heterojunction is used to spearate the doped and undoped regions of the channel to provide very high electron mobilities (corresponding to applied fields below 5 kV/cm in FIG. 1). The electrons flow in a very thin layer (a two-dimensional electron gas) at the heterojunction interface. These are not power devices because of the thin conducting layer and because they suffer the Gunn effect at high fields.

Another restriction in prior art FETs is the choice of substrate materials on which a FET is fabricated. Lattice mismatches >0.1% result in very poor material quality. Most prior art microwave FETs are made from GaAs or AlGaAs on GaAs substrates, or InGaAs on InP substrates because these materials are lattice matched. Very few such matches exist for semiconductor combinations otherwise satisfying the requirements of various prior art devices.

U.S. Pat. No. 4,163,237 discloses an FET having a lattice matched superlattice as its channel material. The device is based on the technique of modulation doping. It possesses improved low field transport at low temperatures. No mention is made of improved high-frequency response or of improved carrier velocity at high electric fields.

SUMMARY OF THE INVENTION

Accordingly, it is an object of this invention to provide new field-effect transistors which overcome or significantly ameliorate the foregoing disadvantages.

It is another object of this invention to provide an FET device which enables substantial increases in power output and/or frequency when compared to state-of-the-art devices.

It is yet another object of this invention to provide an FET which has a suppressed Gunn effect and displays higher carrier velocities at higher fields.

It is a further object of this invention to provide such a field-effect transistor which allows greatly increased latitude and choice of active FET materials and also substrate materials.

Upon further study of the specification and appended claims, further objects and advantages of this invention will become apparent to those skilled in the art.

These objects have been achieved by providing a field effect transistor comprising a semiconductor having a source, a drain, a channel and a gate in operational relationship, the semiconductor being a strained layer superlattice comprising alternating quantum well and barrier layers, and the quantum well layers and barrier layers being selected from the group of layer pairs consisting of InGaAs/AlGaAs, InAs/InAlGaAs, and InAs/InAlAsP; the layer thicknesses of the quantum well and barrier layers being sufficiently thin that the alternating layers constitute a superlattice which has a superlattice conduction band energy level structure in k-vector space which includes a lowest energy Γ-valley and a next lowest energy L-valley, each k-vector corresponding to one of the orthogonal directions defined by the planes of said layers and the directions perpendicular thereto; the layer thicknesses of said quantum well layers being selected to provide a superlattice $L_{2D}$-valley which has a shape which is substantially more two-dimensional than that of said bulk L-valley, said two-dimensionality being substantially in the plane defined by the k-vectors corresponding to the orthogonal directions in the planes of the superlattice layers, whereby, at applied electric fields higher than that at which the maximum electron velocity occurs in said first material when in bulk form, the electron velocities are higher in said superlattice than they are in said first semiconductor material in bulk form.

In addition, the objects have been achieved by a field-effect transistor comprising a having a source, a drain, a channel and a gate in operational relationship, said channel consisting of a semiconductor being a strained layer superlattice comprising alternating lattice-mismatched quantum well and barrier layers, the quantum well layers being selected of a material having an energy difference between the lowest energy level in $L_{2D}$-valleys and the lowest energy level in $\Gamma_{2D}$-valleys greater than 0.3 eV, the value of GaAs, and a bandgap value less than 1.424 eV, the value of GaAs, and the barrier layers being selected of a material having an energy level at the top of the $\Gamma$-valley greater than the energy of the L-valley of the quantum well material, the thickness of the quantum well layers being less than about 100 angstroms, and the thickness of said barrier layers being in the range of 50-400 angstroms.

The latter description is based upon the present understanding of the theoretical basis of the device of this invention and in no way is to be construed to limit the scope thereof.

BRIEF DESCRIPTION OF THE DRAWINGS

Various other objects, features and attendant advantages of the present invention will be more fully appreciated as the same become better understood when considered in conjunction with the accompanying drawings, and wherein:

FIG. 1 shows electron velocities as a function of electric field for conventional semiconductors and for a strained layer superlattice of this invention; and FIG. 2 illustrates one typical configuration of an FET of this invention.

DETAILED DISCUSSION

Herein, the term "superlattice" has its conventional meaning; i.e., it is a semiconductor entity which comprises alternating layers of two different semiconductor materials, one forming quantum well layers (narrower gap in bulk) and the other forming barrier layers (wider gap in bulk). The alternating nature of the structure quantizes the available energy levels in the quantum well layers. The set of alternating layers forms a new semiconductor material having its own new set of semiconductor properties, including bandgap, lattice constant, transport properties, conduction band structure, valence band structure, etc. Superlattice and quantum well structures per se are known and are described in many publications and patent applications. In essence, quantum well and superlattice effects will be achieved if the thickness of the alternating layers is appropriately and conventionally selected to be sufficiently thin that the necessary quantum size effect occurs in the narrower gap layers, i.e., in the quantum well layers. The wide gap barrier layers form a potential energy barrier for each of the narrower gap quantum well layers. The high potential energy at the layer interfaces traps the carriers in the lower energy narrower gap material at low fields and forms the basis for a quantized energy band structure therein.

There are two types of superlattices: those having layers which are lattice matched and those having layers which are not lattice matched. Certain ones of the latter type, strained layer superlattices (SLS's), are preferred for use in this invention. In such structures, the lattice mismatch is essentially totally accommodated by uniform lattice strain so that no misfit dislocations are generated at the interfaces. Other conditions for a SLS that must be satisfied include a maximum mismatch degree (typically around 7-8% difference in lattice constants) and adequately thin layer thicknesses (e.g., generally less than about 500 angstroms and usually much lower, preferably less than 100 angstroms). In SLS's, misfit dislocations are suppressed because they become energetically unfavorable. Very advantageously, SLS structures act as barriers to dislocation propagation from underlying layers, e.g., from graded layers having a topmost lattice constant fairly well matched to the superlattice lattice constant or even from underlying layers which have significantly different lattice constants.

Latitude in material selection is also increased since the absence of a lattice matching requirement enables growth of SLS's from a wide variety of alloy systems as long as the maximum degree of lattice mismatch and the layer thicknesses which are permitted thereby are not exceeded. For a given lattice mismatch, for a given semiconductor system, there will be a maximum layer thickness at which SLS effects will be observed. In general, the greater the lattice mismatch, the thinner the layers must be.

The absence of misfit defects allows superlattices, including strained layer superlattices, to have crystalline quality equal to that of conventional semiconductor materials. This crystallinity can be maintained even when the substrate has threading dislocations. The latter will be forced to propagate parallel to the SLS interfaces due to the strains in the layers. Hence, they will be confined to the first few SLS layers and will not degrade the crystal quality of the bulk of the SLS.

When particular superlattices are used in the FET of this invention, improved high-frequency/high-power performance is observed as exemplified by the improved velocity-field characteristics shown in FIG. 1. These improved transport properties are due to improved channel characteristics based on use of the superlattice to conduct the carrier electrons from the source to the drain of the transistor. See FIG. 2 for a schematic diagram of a typical configuration of an FET of this invention.

The achievement of higher electron velocities at higher electric fields can be explained in terms of changes in conduction band energy level structure when going from a bulk material to a superlattice containing quantum wells based on that material.

The energy level structure of the conduction band in k-vector space comprises several distinct valleys, each containing many levels. For the materials of this invention, the lowest lying is termed the $\Gamma$-valley. Electrons in the $\Gamma$-valley have good transport properties, i.e., they have values of electron velocities, effective masses, mobilities, etc., at the temperature of interest, typically room temperature, whereby a good high frequency, high power response is observed. It is such electrons which are responsible for the conventional high electron velocities at low electric fields.

In these materials, the next lowest energy level valley is termed the L-valley. In a bulk semiconductor normally employed in high frequency FET's, many of the carriers will occupy energy levels in the L-valley at high electric fields and at room temperature. Unfortunately, electrons in the L-valley have poor transport properties, i.e., lower electron velocities and higher electron effective masses. There are also other, usually higher-lying valleys. The next highest are termed X-valleys, which also have associated therewith poor transport properties. However, at normal operational temperatures in GaAs, the electron velocities have already been reduced by the L-valleys before occupation of the higher lying X-valleys becomes significant.

When conventional FETs are driven by electric fields of high frequency and magnitude, electrons are electrically "heated" out of the $\Gamma$-valley, where they had relatively low effective mass, $m^*$, and good transport properties, into higher energy states such as the L- and X-valleys, where they have relatively high effective mass and poor transport properties. As shown in FIG. 1, the degraded average electron velocity in the higher energy states causes the well-known Gunn effect; i.e., undesirable instability in a FET.

In this invention, the FET is a SLS made from particular materials having the property that relatively fewer "heated" electrons populate 2-D L-valleys which have relatively low effective mass, allowing larger average electron velocity and suppressing Gunn effect. Since the effective mass of the X-valleys is not appreciably improved, the SLS materials are further selected to ensure that the "heated" electrons populate the L-valleys over the largest range of electric fields possible before significantly populating the X-valleys.

In summary, this invention provides a semiconductor channel for an FET in which the probability that an electron will occupy a L-valley state at high electric fields is reduced and, for electrons which do transfer to the L-valley, the transport properties are better than they would otherwise be in a corresponding bulk semiconductor L-valley state. These features combine to provide higher electron velocities at higher electric fields as schematically illustrated in the graph of FIG. 1.

The foregoing effects have been demonstrated in calculations based on empirical tight binding approximations well-known to those skilled in the art. See, e.g., Osbourn, J. Appl. Phys., 53(3), 1586(1982); and Osbourn et al., J. Vac. Sci. Technol., 16(5), Sept./Oct., 1529(1979). Good agreement between these calculations and experimental results have been observed. Hence, such calculations provide highly reliable bases for fabricating the devices of this invention. Typically, irrespective of the fine details of the tight binding model, the predicted behavior and associated device parameters, e.g., layer thicknesses, layer compositions, etc., in conjunction with the usual considerations of superlattice requirements, will provide a reliable basis for formulating an initial device design. It will then be possible to routinely optimize device design, e.g., with a few routine experiments.

In order to construct a FET channel according to this invention, the superlattice structures must meet the following criteria:

(a) The quantum well layer should have the largest energy difference between the lowest energy level in the two-dimensional L-valleys ($L_{2D}$) and the lowest energy level in the two-dimensional Gamma valley ($\Gamma_{2D}$), thereby providing a large energy range for Gamma valley conduction. This criterion is controlled by the choice of well materials and well thickness. This value should be greater than the energy difference for GaAs, 0.3 eV.

(b) The SLS should have the largest range of energies for which the L-like states are two-dimensional, thereby providing higher L-valley carrier velocities and more electrons in the high velocity Gamma valley. In essence, this means that the quantum well layers should be chosen to be as thin as possible, while barrier thickness should be relatively large. This requirement will be more stringent than that imposed on layer thicknesses by normal superlattice considerations alone, i.e., quantum well layers will be thinner than otherwise satisfactory in superlattices. Tight binding calculations provide reliable guidelines on suitable thicknesses.

Quantum well layer thicknesses will typically be less than 100 angstroms for FETs operating at room temperature, or preferably even lower. Barrier layer thicknesses will be in the same range as normally required in conventional SLSs, e.g., 50–400 angstroms. They will normally be selected to be thick enough to ensure the two-dimensional nature of the states in the $L_{2D}$-valleys over a useful energy range. The total number of alternating layers will be conventionally determined to provide the desired operating characteristics for the FET in its end-use environment. Basically, the thickness of the superlattice will be determined by the same requirements which determine the thickness of conventional FET channels. For a given carrier concentration and a given set of operational requirements, the number of layers and, hence, the overall superlattice channel thickness will be chosen to provide the necessary depletion layer thickness in the region connecting the source and the drain via the conventional gate.

(c) The quantum well layer should have small electron effective mass values $m_e$ in the well layer, thereby providing better Gamma valley velocities. In other words, the well layer material should have a small bandgap, as the $\Gamma$-valley $m_e$ is roughly proportional to the bandgap value. This value should be less than the bandgap of GaAs, 1.424 eV.

(d) The barrier layer should avoid conduction due to small Gamma barrier heights, thereby avoiding low velocities in the barrier. Barrier layers are chosen to provide potential barriers at the interfaces which are as high as possible. Very high barriers will decrease the probability of electrons escaping from the quantum wells to occupy higher energy, poor transport states. This generally means that the barrier layers should have large gaps and conduction band configurations with $\Gamma$- and L-valleys lying as high in energy as possible, to minimize the probability of high energy electrons transferring to lower-velocity states. In other words, the energy of the L-valley of the well layer should be lower than the energy level of the $\Gamma$-valley of the barrier layer.

Specific barrier/quantum well combinations of interest known to meet these criteria are AlGaAs/InGaAs, InAlGaAs/InAs, and InAlAsP/InAs.

In particular, calculations show that a strained-layer superlattice formed of the alloys $In_xGa_{1-x}As$ (especially with $x \geq 0.2$) as the well material and $Al_yGa_{1-y}As$ ($y < 0.45$ and, preferably, $0.4 \leq y < 0.45$) as the barrier material satisfies all four of the conditions set forth above. Furthermore, a strained layer superlattice formed of the alloys $In_xGa_{1-x}As$ (with x near 1.0) as well material and $Al_{1-y}In_yAs_zP_{1-z}$ (with $y > 0.4$ and z small) or $In_yAl_zGa_{1-y-z}As$ (with $y > 0.4$, z as large as possible) as barrier material are also satisfactory, but their range of operating fields is less than the InGaAs-/AlGaAs superlattice due to the lower breakdown field values of the In-rich InGaAs alloy wells compared with the Ga-rich InGaAs alloy wells. As a result, a FET structure fabricated from these SLS's cannot operate at power levels as large as those of a similar FET fabricated from the other SLS.

Similar calculations of the prior art lattice matched $GaAs/Al_xGa_{1-x}As$ system shows it to be a particularly poor choice for high power, high frequency, operation, except if $0.4 \leq x < 0.45$. All other values of x either have conduction in the barrier layers (if $x < 0.4$) or have "heated" electrons transfer to a high electron mass, low electron mobility, X-valley instead of a lower mass, higher mobility, L-valley (for $x > 0.45$). Even for $0.4 \leq x < 0.45$, condition b is not well satisfied as the range of energies for 2-D L states is always less than 50 meV, compared with 100's of meV for the preferred systems.

Although complete calculations have not been performed, GaSb/AlGaSb and InAsSb/InAlSb are also believed to be additional pair combinations that may be satisfactorily used in the practice of this invention.

In general, unless indicated otherwise herein, all details regarding the fabrication, design and use of the FETs of this invention will be entirely conventional, e.g., as described in many publications, including DiLorenzo et al., supra, Carroll, *Hot Electron Microwave Generators*, Arnold Publishers, London, 1970.

A typical FET structure is shown in FIG. 2. Source and drain regions are formed by conventional means such as diffusion or, preferably, ion implantation. Often, source and drain regions will be doped n+ while the SLS channel region will be n-type. The carriers will move parallel to the plates of the superlattice layers. In order to improve transport between the edges of the source and drain regions and the channel region, a diffusion or ion implantation alloying technique can be used whereby very good contact is achieved along the interface of the source/channel and drain/channel regions, ensuring that the full superlattice structure is utilized. The alloying technique can intermix the layered SLS structure into a bulk alloy in the limited source and drain regions to achieve the desired good contact. Conventional gate, source and drain electrodes can be employed. Preferably a Schottky barrier gate is used. The gate voltage creates the necessary depletion in the channel region.

FIG. 2 shows a buffer between the underlying substrate and the superlattice structure. This buffer is not required in all cases. Where there would be an otherwise unacceptable lattice mismatch between the superlattice and the substrate, a buffer will be employed. A typical buffer is a graded layer whose topmost layer closely matches the lattice constant of the superlattice. Conventional substrates can be employed, preferably semi-insulating substrates such as gallium arsenide which will reduce parasitic losses. The proton isolation region is a region of low conductivity prepared fully conventionally by ion implantation.

As mentioned above, the FET's of this invention will typically be microwave FET's. Such devices are normally employed when high-power (e.g., fields of 10–100 kv/cm) and/or high frequency (e.g., $10^{10}$–$10^{12}$ Hz) operation is desired. Such applications include high-frequency switches and devices with gate lengths on the order of a micrometer or less in dimension. Details of the use of the FET's of this invention for any application are essentially the same as for the use of conventional FET's.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

Calculations using the conventional semiempirical tight binding model discussed above have been made on indium gallium arsenide and gallium arsenide based strained-layer superlattice materials. These show that such SLSs can have the required band structure properties to have higher velocities at high electric fields at which the Gunn effect degrades velocities in GaAs. The degree of improvement depends on the specific SLS structure used. In addition, AlGaAs, rather than GaAs, is the preferred barrier material for a FET. Results obtained from band structure calculations of a gallium arsenide/indium gallium arsenide strained layer superlattice (with superlattice planes parallel to the (100) surface) showed the following characteristics: Bandgaps and intervalley separations were calculated for GaAs-$In_xGa_{1-x}As$ SLS's for various x values and for various layer thicknesses. For x=0.2 and individual SLS layer thicknesses of 75 A, Eg=1.22 eV and the intervalley separation is 0.36 eV. For an $In_{0.17}Ga_{0.83}As$/$In_{0.50}Ga_{0.50}As$ SLS with 127 A/64 A layer thicknesses, Eg=0.93 eV and the intervalley separation is 0.46 eV, showing a preference for indium-rich indium gallium arsenide since the optimal superlattice structure is one with the largest intervalley separation.

EXAMPLE 2

For the same systems, using the same band model, calculations of effective mass values were made. These directly correlate with carrier velocities and determine the velocity saturation for a given SLS structure, lower masses correlating with higher saturation velocity values. It is from these effective mass values that the estimated higher electron velocities shown in FIG. 1 were derived.

Effective mass (m*) values were calculated for the two-dimensional (2-D) band structure associated with the $L_{2D}$ valleys in the SLS's of Example 1. Because the bulk L-valleys have non-isotropic m* values (associated with a constant energy ellipsoid oriented along the {111} directions), the 2-D mass values for the associated valleys in a (100) SLS are significantly different from bulk values. The calculations show that the satellite valleys have a 2-D ellipse of constant energy (at the band minima) oriented along the {111} directions parallel to the (100) interfaces. The two mass components are relatively insensitive to SLS composition, and have the values $m_l*(110) \sim 0.2 m_e$ and $m_t*(110) \sim 0.1\ m_e$. The GaAs/$In_xGa_{1-x}As$ SLS structures with x=0.2 must have GaAs layers thick enough (>40 A) and $In_xGa_{1-x}As$ layers thin enough (<100 A) to ensure that the band structure is essentially two-dimensional. The 2-D masses in the SLS L-valleys are close to the isotropic effective mass of the central Γ-valley ($m_e* \sim [0.067-0.044x]m_e$ for $In_xGa_{1-x}As$), so that high field velocities in these valleys can approach that of the central valley [$v_s$(Γ-valley)$\sim$2–3$\times 10^7$ cm/s]. As a result, the high field $v_s$ of InGaAs SLS's will not be so seriously degraded by intervalley transfer of carriers into the $L_{2D}$ minima as in bulk systems.

EXAMPLE 3

A further calculation was performed on the same systems to determine the effect on the density of states and energies near the minima of the valleys. The calculations showed that the ratio of the density of states (at energies near the minima) of the SLS L-valley to the SLS Γ-valley is reduced compared to the same ratio in bulk gallium arsenide. This ratio depends in detail on the SLS structure through its effect on the energies of the higher lying subbands for the two types of minima.

For the lowest subbands, the density of states ratio $\rho_L(E-E_L)/\rho_\Gamma(E-E_\Gamma)$ can be reduced by a factor of ~3 compared to bulk GaAs. This reduction in the density of states ratio reduces the probability of an electron being in the L-valleys at high electric fields.

From the foregoing description, one skilled in the art can easily ascertain the essential characteristics of this invention, and without departing from the spirit and scope thereof, can make various changes and modifications of the invention to adapt it to various usages and conditions.

We claim:

1. A field-effect transistor comprising a semiconductor having a source, a drain, a channel and a gate in operational relationship,
   said semiconductor being a strained layer superlattice comprising alternating quantum well and barrier layers,
   said quantum well layers and barrier layers being selected from the group of layer pairs consisting of InGaAs/AlGaAs, InAs/InAlGaAs, and InAs/InAlAsP;
   wherein the layer thicknesses of said quantum well and barrier layers are sufficiently thin that the alternating layers constitute a superlattice which has a superlattice conduction band energy level structure in k-vector space which includes a lowest energy Γ-valley and a next lowest energy L-valley, each k-vector corresponding to one of the orthogonal directions defined by the planes of said layers and the directions perpendicular thereto;
   and wherein the layer thicknesses of said quantum well layers are selected to provide a superlattice $L_{2D}$-valley which has a shape which is substantially more two-dimensional than that of said bulk L-valley, said two-dimensionality being substantially in the plane defined by the k-vectors corresponding to the orthogonal directions in the planes of the superlattice layers,
   whereby, at applied electric fields higher than that at which the maximum electron velocity occurs in said first material when in bulk form, the electron velocities are higher in said superlattice than they are in said first semiconductor material in bulk form.

2. The field effect transistor of claim 1 wherein said quantum well layers have a thickness less than about 100 Å.

3. The field effect transistor of claim 1 wherein said barrier layers have a thickness as large as possible while still achieving a superlattice effect.

4. The field effect transistor of claim 1 wherein said source and drain regions are formed by ion implantation in said superlattice.

5. The field effect transistor of claim 1 wherein the maximum frequency response is in the microwave region.

6. The field effect transistor of claim 5 wherein said source and drain regions are n+-type and said channel region is n-type.

7. The field effect transistor of claim 1 wherein said gate is a Schottky barrier gate.

8. A field-effect transistor having a source, a drain, a channel and a gate in operational relationship, said channel consisting of a semiconductor being a strained layer superlattice comprising alternating lattice-mismatched quantum well and barrier layers;
   said quantum well layers being selected of a material having:
   an energy difference greater than 0.3 eV, the value of GaAs, between the lowest energy level in $L_{2D}$ valleys and the lowest energy level in $\Gamma_{(2-D)}$ valleys; and
   a bandgap value less than 1.424 eV, the value of GaAs;
       said barrier layers being selected of a material having a Γ-valley energy level greater than the L-valley energy of the quantum well material;
       the thickness of said quantum well layers being less than about 100 angstroms, the thickness of said barrier layers being in the range of 50–400 angstroms.

9. The field-effect transistor of claim 8 wherein said quantum/barrier layers consist of one of the following combinations: InGaAs/AlGaAs, InAs/InAlGaAs, InAs/InAlAsP, GaSb/AlGaSb, and InAsSb/InAlSb.

* * * * *